(12) United States Patent
Rubner et al.

(10) Patent No.: US 6,630,793 B2
(45) Date of Patent: Oct. 7, 2003

(54) HIGH EFFICIENCY SOLID STATE LIGHT-EMITTING DEVICE AND METHOD OF GENERATING LIGHT

(75) Inventors: Michael F. Rubner, Westford, MA (US); Hartmut Rudmann, Watertown, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 23 days.

(21) Appl. No.: 09/928,515

(22) Filed: Aug. 14, 2001

(65) Prior Publication Data

US 2002/0047551 A1 Apr. 25, 2002

Related U.S. Application Data

(60) Provisional application No. 60/225,589, filed on Aug. 16, 2000.

(51) Int. Cl.[7] .................................................. G09G 3/10
(52) U.S. Cl. ............................. 315/169.1; 315/169.3; 313/483
(58) Field of Search ........................ 315/169.2, 169.1, 315/169.3, 246; 313/483; 428/917

(56) References Cited

U.S. PATENT DOCUMENTS

| | | | |
|---|---|---|---|
| 3,900,418 A | 8/1975 | Bard et al. | 313/358 |
| 5,075,172 A | 12/1991 | Dixon et al. | 428/422 |
| 5,275,967 A | 1/1994 | Taniguchi et al. | 437/127 |
| 5,324,457 A | 6/1994 | Zhang et al. | 252/700 |
| 5,677,546 A | 10/1997 | Yu | 257/40 |
| 5,682,043 A | 10/1997 | Pei et al. | 257/40 |
| 5,717,289 A * | 2/1998 | Tanaka | 313/503 |
| 5,861,219 A | 1/1999 | Thompson et al. | 428/690 |
| 5,958,573 A | 9/1999 | Spitler et al. | 428/323 |

OTHER PUBLICATIONS

Wai Kin Chan et al.: "Light–Emitting Multifunctional Rhenium (I) and Ruthenium (II)2,2'–bipyridyl Complexes with Bipolar Character"; Applied Physics Letters, American Inst. Of Physics, NY, vol. 75, No. 25, Dec. 20, 1999; pp. 3920–3922.

Adachi, Chihaya, et al., "High–efficiency organic electrophosphorescent devices with tris(2–phenylpyridine)iridium doped into electron–transporting materials", Appl. Phys. Lett., vol. 77, No. 6, pp. 904–906, (2000).

Burroughes, J. H. et al., "Light–emitting diodes based on conjugated polymers", Nature, vol. 347, pp. 539–541, (1990).

Burrows, P. E. et al., "Operating lifetime of phosphorescent organic light emitting devices", Applied Physics Letters, vol. 76, No. 18, pp. 2493–2495, (2000).

Elliott, C. Michael et al., "Highly Efficient Solid–State Electrochemically Generated Chemiluminescence from Ester–Substituted Trisbipyridineruthenium(II)–Based Polymers", J. Am. Chem. Soc., vol. 120, No. 27, pp. 6781–6784, (1998).

(List continued on next page.)

Primary Examiner—Don Wong
Assistant Examiner—Thuy Vinh Tran
(74) Attorney, Agent, or Firm—Fish & Richardson P.C.

(57) ABSTRACT

A solid state electrochemical light-emitting device has a high maximum luminance, a high external efficiency, a long half-life, and a low operating voltage. The device includes a solid layer of metal complex distributed in a polymer matrix. The solid layer is contacted by electrodes on each surface. An applied potential across the electrodes generates light with a luminance of at least 30 cd/m$^2$. The light-emitting device can have external quantum efficiencies of at least 2.0%. A light-emitting circuit including an AC voltage waveform generator coupled to the electrodes of the device is also described.

42 Claims, 13 Drawing Sheets

OTHER PUBLICATIONS

Gao, Frank G. and Bard, Allen J., "Solid–State Organic Light–Emitting Diodes Based on Tris(2,2'–bipyridine)ruthenium(II) Complexes", J. Am. Chem. Soc., vol. 122, No. 30, pp. 7426–7427, (2000).

Greenham, Neil et al., "Angular Dependence of the Emission from a Conjugated Polymer Light–Emitting Diode: Implications for Efficiency Calculations", Advanced Materials, vol. 6, No. 6, pp. 491–494, (1994).

Handy, Erik S. et al., "Development of the tris–chelated polypyridyl ruthenium (II) complex as a solid–state light emitter", SPIE, vol. 3476, pp. 62–67, (1998).

Handy, Eric S. et al., "Solid–State Light–Emitting Devices Based on the Tris–Chelated Ruthenium(II) Complex. 2. Tris(bipyridyl)ruthenium(II) as a High–Brightness Emitter", J. Am. Chem. Soc., vol. 121, No. 14, pp. 3525–3528, (1999).

Ho, Peter K. H. et al., "Molecular–scale interface engineering for polymer light–emitting diodes", Nature, vol. 404, pp. 481–484, (2000).

Huang, M. B. et al., "Suppression of penetration of aluminum into 8–hydroxyquinoline aluminum via a thin oxide barrier", Applied Physics Letters, vol. 73, No. 20, pp. 2914–2916, (1998).

Kwong, Raymond Co. et al., "Efficient, Saturated Red Organic Light Emitting Devices Based on Phosphorescent Platinum(II) Porphyrins", Chem. Mater., vol. 11, No. 12, pp. 3709–3713, (1999).

Kwong, Raymond Co. et al., "Organic Light–emitting Devices Based on Phosphorescent Hosts and Dyes", Advanced Materials, vol. 12, No. 15, pp. 1134–1138, (2000).

Lee, J.–K. et al., "Thin film light emitting devices from an electroluminescent ruthenium complex", Appl. Phys. Lett., vol. 69, No. 12, pp. 1–3, (1996).

Lee, Jin–Kyu et al., "Synthesis and Characterization of an Electroluminescent Polyester Containing the Ru(II) Complex", Chemistry of Materials, vol. 9, No. 8, pp. 1710–1712, (1997).

Lyons, C. H. et al., "Solid–State Light–Emitting Devices Based on the Trischelated Ruthenium (II) Complex. 1. Thin Film Blends with Poly(ethylene oxide)", J. Amer. Chem. Soc., vol. 120, No. 46, pp. 12100–12107, (1998).

Ma, Yuguang et al., "Electroluminescence from triplet metal–ligand charge–transfer excited state of transition metal complexes", Synthetic Metals, vol. 94, pp. 245–248, (1998).

Maness, Karolyn M. et al., "Solid–State Diode–like Chemiluminescence Based on Serial, Immobilized Concentration Gradients in Mixed–Valent Poly[Ru(vbpy)$_3$](PF$_6$)$_2$ Films", J. Am. Chem. Soc., vol. 118, pp. 10609–10616, (1996).

Maness, Karolyn M., et al., "Solid State Electrochemically Generated Luminescence Based on Serial Frozen Concentration Gradients of $Ru^{III/II}$ and $Ru^{II/I}$ Couples in a Molten Ruthenium 2,2'–Bipyridine Complex", J. Am. Chem. Soc., vol. 119, No. 17, pp. 3987–3993, (1997).

Mitschke, Ulrich and Bäuerle, Peter, "The electroluminescence of organic materials", J. Mater, Chem. vol. 10, pp. 1471–1507, (2000).

Nagai, Keiji et al., "Molecular distribution of photoluminescent $Ru(bpy)_3^{2+}$ dispersed in a polymer film and its distance–dependent concentration quenching", J. Photochem. Photobiol. A: Chem., vol. 84, pp. 271–277, (1994).

Pei, Qibing et al., "Polymer Light–Emitting Electrochemical Cells", Science, vol. 269, pp. 1086–1088, (1995).

Rudman, H, et al., "Improved Device Performance of [Ru(bpy)$_3$](PF$_6$)$_2$ Light Emitting Devices", Am. Chem. Soc. Abstracts, vol. 220, 169–PMSE, (2000).

Tang C. W. and VanSlyke, A., "Organic electroluminescent diodes", Appl. Phys. Lett., vol. 51, No. 12, pp. 913–915, (1987).

Wu, Aiping et al., "Electrochemically Based Light Emitting Devices From Sequentially Absorbed Multilayers of a Polymeric Ruthenium (II) Complex and Poly(Acrylic Acid)", Materials Research Society, vol. 488, pp. 63–68, (1998).

Wu, Aiping, et al., "Light emitting electrochemical devices from sequentially absorbed multilayers of a polymeric ruthenium (II) complex and various polyanions", Thin Solid Films, 327–329, pp. 663–667, (1998).

Wu, A. et al., "Solid–State Light Emitting Devices Based on the Tris–Chelated Ruthenium(II) COmplex: 3. High Efficiency Devices via a Layer–by–Layer Molecular–Level Blending Approach", J. Am. Chem. Soc., vol. 121, No. 20, pp. 4883–4891, (1999).

Yoo, Dongsik et al., "New Electro–Active Self–Assembled Multilayer Thin Films Based On Alternately Adsorbed Layers of Polyelectrolytes and Functional Dye Molecules", Synthetic Metals, vol. 85, pp. 1425–1426, (1997).

Yu, Gang, et al., "Complex admittance measurements of polymer light–emitting electrochemical cells: Ionic and electronic contributions", Applied Physics Letters, vol. 73, No. 1, pp. 111–113, (1998).

* cited by examiner

HIGH EFFICIENCY SOLID STATE LIGHT-EMITTING DEVICE AND METHOD OF GENERATING LIGHT

CLAIM OF PRIORITY

This application claims priority to U.S. Patent Application Serial No. 60/225,589, filed on Aug. 16, 2000, the entire contents of which are hereby incorporated by reference.

FEDERALLY SPONSORED RESEARCH OR DEVELOPMENT

This invention was made with government support under Grant Nos. N00014-91-J-1381 and N00014-95-1-1291 awarded by the Department of the Navy AND under Grant No. DMR-9808941 awarded by the National Science Foundation. The government may have certain rights in the invention.

TECHNICAL FIELD

This invention relates to a solid state electrochemical light-emitting device.

BACKGROUND

Light-emitting devices can be used, for example, in displays (e.g., flat-panel displays), screens (e.g., computer screens), and other items that require illumination. Accordingly, the brightness of the light-emitting device is one important feature of the device. Also, low operating voltages and high efficiencies can improve the viability of producing emissive devices.

Light-emitting devices can release photons in response to excitation of an active component of the device. Emission can be stimulated by applying a voltage across the active component (e.g., an electroluminescent component) of the device. The electroluminescent component can be a polymer, such as a conjugated organic polymer or a polymer containing electroluminescent moieties or layers of organic molecules. Typically, the emission can occur by radiative recombination of an excited charge between layers of a device.

The energy of the emitted light can correspond to the energy difference between bands, i.e., between the ground state and excited state of the materials. The emitted light has an emission profile that includes a maximum emission wavelength, and an emission intensity, measured in luminance (candelas/square meter; $cd/m^2$). The emission profile, and other physical characteristics of the device, can be altered by the electronic structure (e.g., energy gaps) of the material. For example, the brightness, range of color, efficiency, operating voltage, and operating half-lives of light-emitting devices can vary based on the structure of the device.

SUMMARY

In general, the invention features a solid state electrochemical light-emitting device having a high maximum luminance, a high external efficiency, a long half-life, and a low operating voltage.

In one aspect, a solid state electrochemical light-emitting device includes a solid layer, a first electrode, and a second electrode. The solid layer includes a non-polymeric metal complex distributed in a polymer matrix. The solid layer has a first surface and a second surface. The first electrode contacts the first surface of the solid layer. The second electrode contacts the second surface of the solid layer.

In another aspect, a solid state light-emitting circuit includes a solid state electrochemical light-emitting device and a driver. The solid state electrochemical light-emitting device includes a solid layer including a metal complex. The solid layer has a first surface and a second surface. A first electrode is in contact with the first surface. A second electrode is in contact with the second surface. The driver includes an AC voltage waveform generator. The driver is configured to apply an AC voltage waveform across first electrode and the second electrode, whereby the solid state electrochemical light emitting device emits light. The driver can also include a DC voltage generator configured to apply a DC voltage across first electrode and the second electrode. The device can have an external efficiency of at least 1.0 percent at a luminance of at least 100 $cd/m^2$.

In yet another aspect, a method of generating light includes applying a light-generating potential across a first electrode and a second electrode of a solid state electrochemical light-emitting device and generating light from the device having a luminance of at least 30 $cd/m^2$. The device includes a solid layer, a first electrode, and a second electrode. The solid layer includes a non-polymeric metal complex distributed in a polymer matrix. The solid layer has a first surface and a second surface. The first electrode contacts the first surface of the solid layer. The second electrode contacts the second surface of the solid layer. The light-generating potential can be applied by applying a DC voltage across the first electrode and the second electrode for a predetermined period of time and applying an AC voltage waveform across the first electrode and the second electrode after the predetermined period of time. The predetermined period of time, known as the charging time, is the time at a voltage at which light visible to the unaided eye is detectable. The AC voltage waveform can be a square wave. The AC voltage waveform can be a 50% duty cycle.

In another aspect, the invention features a method of manufacturing a solid state light-emitting device. The method includes depositing a solid layer including a non-polymeric metal complex distributed in a polymer matrix onto a first electrode and placing a second electrode onto the solid layer. The device can have a luminance of at least 30 $cd/m^2$. The solid layer can be deposited, for example, by spin coating a solution on a surface of the first electrode.

The device is operated and maintained in an inert atmosphere (i.e., in the absence of oxygen and/or water) or is encapsulated in a matrix having low oxygen or water permeability, such as, for example, an epoxy resin. In certain embodiments, the device can have a luminance of at least 30 $cd/m^2$ (e.g., at least 100 $cd/m^2$, at least 200 $cd/m^2$ or at least 1000 $cd/m^2$) at a potential of between 2.5 and 5.0 V. The device can have a time for an intensity of the device to decrease to one-half of a maximum intensity, or half-life, under a 50% duty cycle at 5 V and 1 kHz of at least 200 hours (e.g., at least 300 hours, at least 400 hours, or at least 500 hours). The device can have an external quantum efficiency ("eqe") of at least 1.0 percent at a luminance of at least 100 $cd/m^2$, or at least 4.0 percent at a luminance of at least 30 $cd/m^2$.

The non-polymeric metal complex is a metal complex that is not part of a polymer backbone or is not rigidly attached to a polymer chain. For example, the metal complex can be linked to a polymer backbone or other support by a flexible linker, such as a C2–C18 alkylene or oxyalkylene group. The non-polymeric metal complex can be a non-polymeric metal bipyridine complex. The metal can be ruthenium or osmium. The metal complex can be a transition metal complex, such as a hexafluorophosphate salt of a ruthenium bipyridine complex. In certain embodiments, the metal complex is a bipyridine complex. The bipyridine can have one or more hydroxymethyl substituent, a C1–18 alkoxycarbonyl substituent, a C1–18 alkyl substituent, a tert-butyl substituent, or a hydroxy substituent, or combinations thereof.

Each electrode can include indium tin oxide, a metal, such as aluminum, silver, gold, platinum, or palladium, or a conducting polymer, such as polypyrrole. In certain embodiments, the first electrode can be indium tin oxide, aluminum, silver, gold, platinum, or palladium. The second electrode can be indium tin oxide, silver, gold, platinum, palladium, and polypyrrole. For example, the first electrode can be silver and the second electrode can be indium tin oxide.

The polymer matrix can include an organic polymer. The organic polymer can be a glassy polymer and can have a low dielectric constant. The organic polymer can include a polymethylmethacrylate, a polystyrene, or a polycarbonate. The non-polymeric metal complex is distributed in the polymer matrix so that the metal complex is homogeneously dispersed or dissolved in the polymer matrix at least as observed under an optical microscope. The concentration of the metal complex in the polymer matrix can be less than 99 percent, less than 95 percent by volume, less than 80 percent by volume, or less than 70 percent by volume.

The solid state electrochemical light-emitting device based on a solid layer of a metal complex exhibits good shelf life, good operational stability, high efficiency, and high luminance, and operates at low voltages. In addition, device fabrication and operation are straightforward and simple. In fact, low cost fabrication techniques, such as spin coating, can be utilized to make the devices. The device can have an external quantum efficiency of 2–2.5%, and a half-life of over 600 hours. For example, external quantum efficiency can be increased by diluting $(Ru(bpy)_3)(PF_6)_2$ in a polymer matrix, such as polymethylmethacrylate (PMMA). The half-life can increase when the device is driven with an AC square wave voltage.

For example, the solid state electrochemical light-emitting device based on a Ru(II) complex can be activated to high brightness without elaborate film fabrication or charging schemes, such as solvent-swelling. In addition, reactive cathode materials (e.g., low work function metals such as Ca, Mg) are not needed, and additional electrolyte materials are not added to the solid layer. Swelling the film with solvent is also not needed for the device to operate. Device performance can be increased by improving the quality of the solid layer by, for example, plasma cleaning of the indium tin oxide electrode and by minimizing exposure to air during device fabrication.

By distributing the non-polymeric metal complex in a polymer matrix, the efficiency of the device can be increased by more than a factor of two. For example, a blend comprised of 60 mole % poly(methyl methacrylate) (PMMA)/40 mole % Ru(II) hexafluorophoshphate complex can exhibit an external quantum efficiency greater than 2% at luminance levels in the 100 to 300 $cd/m^2$ range. The increased external quantum efficiency can be maintained without a significant increase in the operating voltage of the device, for example, when the polymer content of the solid layer is less than or equal to 25 percent by volume.

The low operating voltage of the solid state electrochemical light-emitting device allows an applied bias close to the redox potential of the emitter to be used. The low voltage is sufficient to both induce counter-ion migration and effect the required redox reactions to generate light from the solid layer. At slightly higher voltages, charging times decrease dramatically. By applying a high voltage for a brief amount of time, followed by normal operation at low voltage, the charging time of the device can be significantly reduced. Alternative biasing schemes, such as imposing an alternative current field over a direct current bias, can extend device half-life several-fold at comparable brightness. In addition, the increase in device half-life performance achieved through driving with an AC signal is described in U.S. patent application Ser. No. 09/303,101, filed on Apr. 29, 1999, and incorporated herein by reference in its entirety.

By driving the device with an AC voltage, devices first charged with a DC voltage and subsequently driven with an AC voltage can exhibit half-lives of greater than 500 hours, compared to half-lives of about 100 hours when driven with a DC voltage alone. The improved half-lives can be maintained at luminance levels as high as 300 $cd/m^2$. The devices can be implemented as low cost, high efficiency, high brightness backlights for a variety of electronic devices.

Other devices having a multiple layer structure include at least two thin organic layers (i.e., multi-layer devices including a hole transporting layer, and an electron transporting layer) separating the anode and cathode of the device. The multi-layer devices operate like a diode with a forward bias when the potential applied to the anode is higher than the potential applied to the cathode. Light emitted from such a layered device depends on the direction of the applied bias and the electrode materials. The single solid layer device can emit light under any bias direction when an electrochemically stable electrode material is used, such as a noble metal electrode. In addition, the single solid layer device can employ a variety of electrode materials. Devices prepared with silver as one electrode and indium tin oxide as the second electrode can exhibit external quantum efficiencies in the range of 2.5–5.0% at luminance levels of around 30 $cd/m^2$.

Other features, objects, and advantages of the device and method will be apparent from the description and drawings, and from the claims.

DETAILED DESCRIPTION

Figure 1:
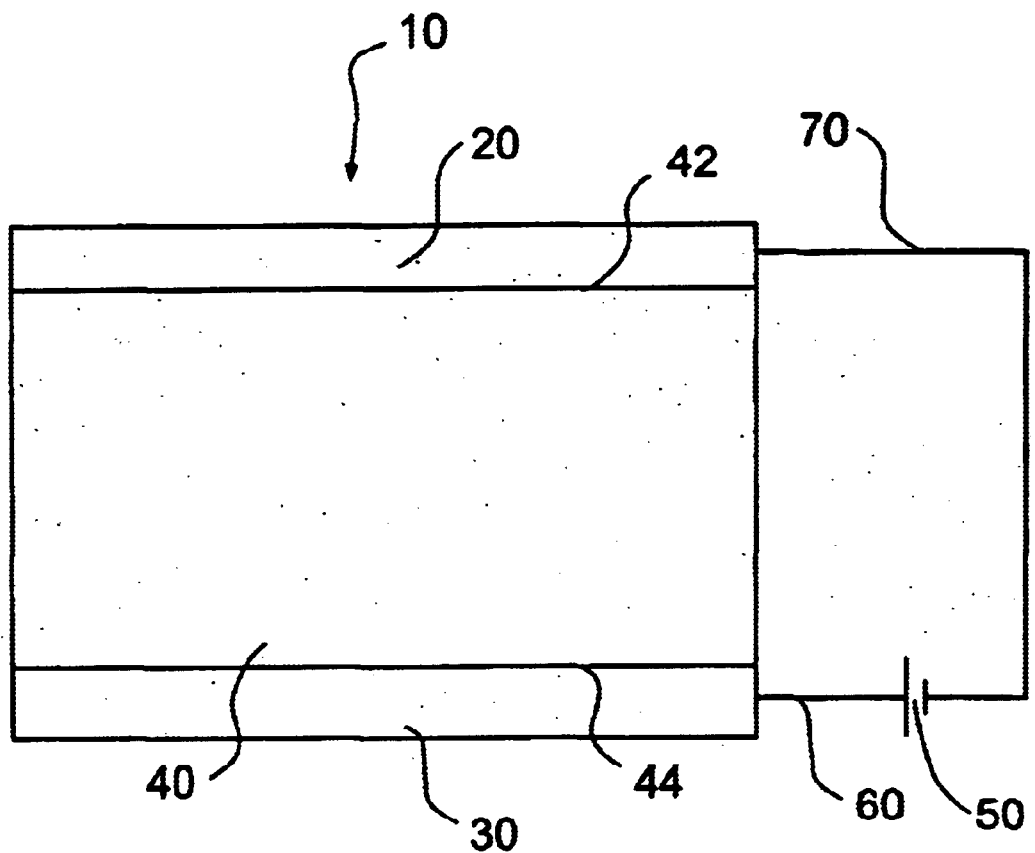
FIG. 1 is a schematic drawing depicting a solid state electrochemical light-emitting device.
Figure 2:
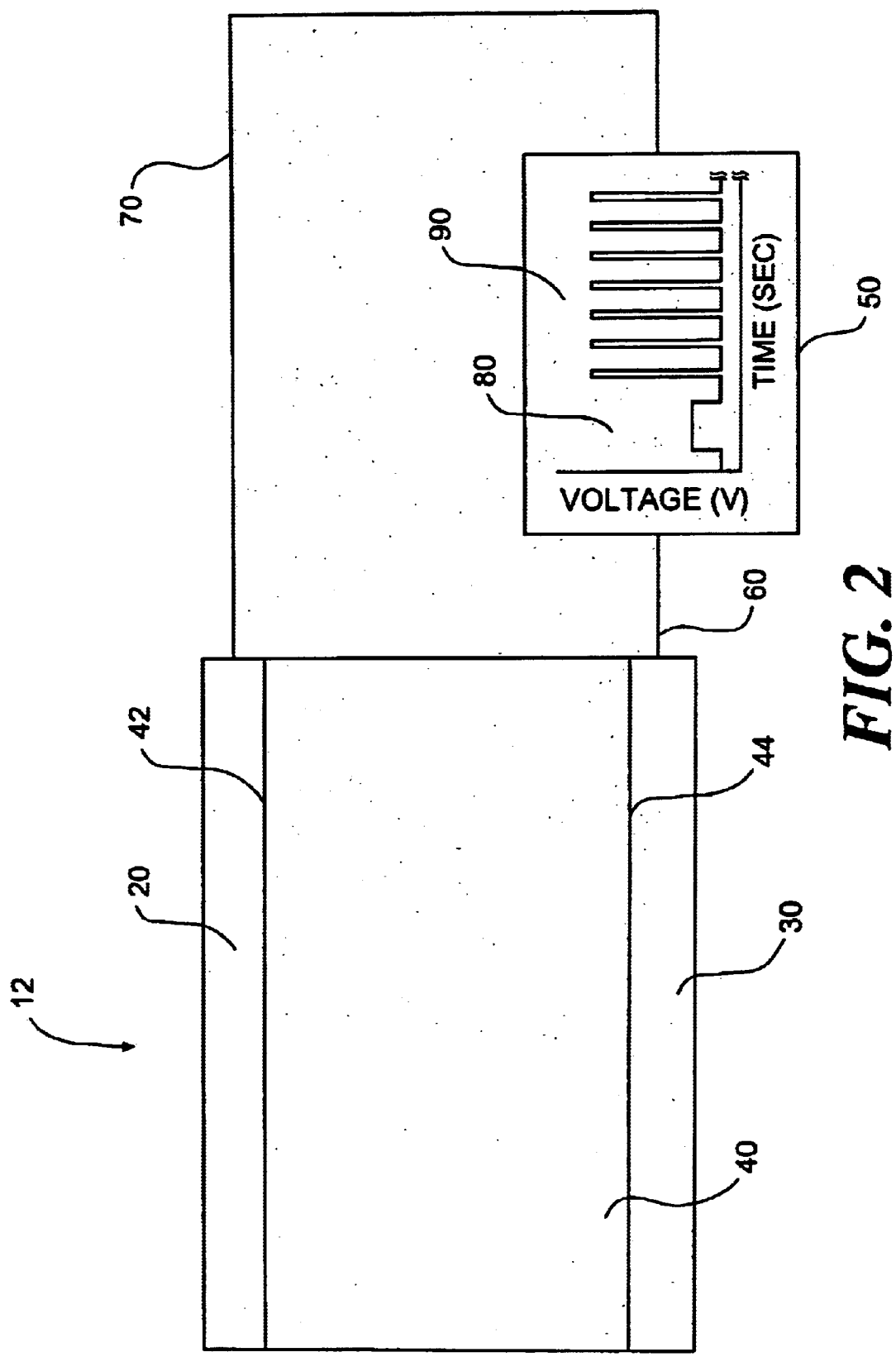
FIG. 2 is a schematic drawing depicting a solid state electrochemical light-emitting device.

Referring to FIGS. 1 and 2, solid state electrochemical light-emitting device 10 includes first electrode 20, second electrode 30, and solid layer 40. Solid layer 40 includes a metal complex. Solid layer 40 has first surface 42 in contact with first electrode 20. Solid layer 40 also has second surface 44 in contact with second electrode 30. First electrode 20 and second electrode 30 are connected to voltage source 50, or a driver, by electrical conductor 60 and electrical conductor 70. When a potential applied by voltage source 50 generates light from the device having a luminance of at least 50 cd/m².

The non-polymeric metal complex of solid layer 40 is electroluminescent. The metal complex can be a salt composed of a cation metal complex and an anion. The metal complex includes a metal ion and one or more ligands. For example, the metal complex can be a redox active metal complex having a conjugated ligand. One example of a suitable metal complex is a ruthenium complex. The ligands of the ruthenium complex can be pyridine-based ligands, such as bipyridine ligands and derivatives thereof (e.g., 4,4'-disubstituted-2,2'-bipyridine compounds). In certain embodiments, the ruthenium complex can be of the formula $Ru(L)_3^{2+}$, where each L, independently, can be selected from the following: 2,2'-bipyridine (bpy), 4,4'-bis(hydroxymethyl)-2,2'-bipyridine, 4,4'-bis(carboxy)-2,2'-bipyridine, C1–C18 alkyl esters of 4,4'-bis(carboxy)-2,2'-bipyridine, C1–C18 alkyl derivatives of 2,2'-bipyridine, 4,4'-bis(tert-butyl)-2,2'-bipyridine, or 4,4'-bis(hydroxy)-2,2'-bipyridine. The electronic nature of the ligand can alter the emission properties of the device. For example, electron withdrawing groups tend to shift the emission wavelength to longer wavelengths.

The anion is electrochemically inert. The anion does not react with the electrode materials, or the metal under the applied operating voltage. The anion can be a phosphate or borate. Examples of suitable anions include hexafluorophosphate ($PF_6^-$), tetrafluoroborate ($BF_4^-$), and perchlorate ($ClO_4^-$). The anion of the metal complex can be changed, for example, by anion metathesis. Ruthenium bipyridine complexes can be prepared using ordinary ligand substitution reactions. The synthesis of substituted bipyridines and ruthenium complexes containing bipyridine ligands is described, for example, in Lee et al. Chemistry of Materials, 9:1710–1712 (1997), which is incorporated herein by reference in its entirety.

The non-polymeric metal complex can be distributed in a polymer matrix. The polymer matrix can include an organic polymer, such as polymethylmethacrylate (PMMA), polystyrene (PS), or polycarbonate (PC). The non-polymeric metal complex can be homogeneously dispersed or dissolved in the polymer matrix. Distributing the non-polymeric metal complex in the polymer matrix can reduce self-quenching effects and can improve the external quantum efficiency of the device. The concentration of the metal complex in the polymer matrix can be less than 99 percent, less than 95 percent by volume, less than 80 percent by volume, or less than 70 percent by volume. A trade off between increasing the external quantum efficiency by diluting the complex in a polymer matrix and maintaining a low operating voltage of the device results from reducing charge-hopping between the active centers and the need to apply higher voltages.

Each of the electrodes is composed of a conductive material. The electrode material can be a transparent material such as indium tin oxide (ITO), a metal such as aluminum, silver, gold, platinum, or palladium, or a conductive polymer, such as polypyrrole. When one of the electrodes is transparent, such as ITO deposited on glass, the light generated by the device shines through the transparent electrode, illuminating the surface of the electrode. The ITO can be cleaned with a plasma treatment.

Referring to FIG. 2, voltage source 50 can be in a circuit and can include a DC voltage generator 80 and an AC voltage generator 90. In operation, DC voltage generator 80 applies a voltage across the first electrode 20 and the second electrode 30 until a steady state light output was reached, for example, for a time period of less than 240 seconds, less than 200 seconds, or less than 180 seconds (e.g., 1–60 seconds). The DC voltage can be between 2 and 15 volts, 2.5 and 10 volts, or 2.8 and 9 volts. Higher DC voltages resulted in lower required charging times. For example, if 2.5 to 3 volts DC is applied, the preconditioning time was about 3 minutes. However, if the DC preconditioning voltage was increased to 6–8 volts, the required preconditioning time dropped to about 30 seconds.

AC voltage generator 90 produces a voltage waveform, such as, for example, a square wave. The waveform can have a frequency of between 100 Hz and 1 MHz, 250 Hz and 100 kHz, or 500 Hz and 10 kHz. The AC voltage waveform can have an average voltage equal to or greater than the redox potential of the non-polymeric metal complex. The average voltage can be between 2 and 10 volts, or 3 and 8 volts. The percentage of duty cycle used is the calculated as one hundred multiplied by the average voltage divided by the maximum voltage. The percentage of duty cycle is the relative time in an on/off cycle (in %) during which the voltage is on. The frequency, duty cycle, and peak voltage can be adjusted to optimize light output and stability from the device. Some applications of a duty cycle are described, for example, in G. Yu et al. Applied Physics Letters 73:111–113 (1998), incorporated herein by reference in its entirety. For example, the AC voltage waveform can be a 50% duty cycle at 5 V and 1 kHz, which has a maximum voltage of 5 volts, a frequency of 1 kHz, and an average voltage of 2.5 volts. In this way, a low average operating voltage can improve the operating half-lives of the devices.

Applying a duty cycle can, for example, result in an balancing between the redistribution of the counter-ions and the injection and transport of charge carriers, which are events that occur on different time scales. For example, the movement of counter-ions under the influence of the applied field is a relatively slow process. At a high frequency of the duty cycle, the counter-ions may no longer follow the voltage cycle and, as a result, can only respond to the time average of the applied voltage waveform. The injection and transport of charge carriers occur on a faster time scale and, as a result, once light generation has commenced, frequencies of up to 1 MHz can be used to maintain light generation. The frequency, duty cycle, and peak voltage can be adjusted to optimize light output and stability. The device can be first operated at a constant voltage until it reaches a steady state light output and then switched to a voltage cycle that pulses the device continuously.

For example, to achieve high stability, the average voltage can be maintained near the redox-potential of around 2.5 V of a $Ru(bpy)_3^{2+}$ complex in a device containing $Ru(bpy)_3^{2+}$. For example, under AC operation a 5 V square wave having a frequency of 1 kHz with a DC offset of 2.5 V, the half life of a device containing $(Ru(bpy)_3)(PF_6)_2$ in a 60 mol % PMMA matrix device can have a half life of 600–700 hours. In the absence of a polymer matrix, a $(Ru(bpy)_3)(PF_6)_2$-based device can have a half-life greater than 500 hours.

When solid layer 40 is a spin-cast film of a bipyridine complex of ruthenium, electrode 20 is an aluminum electrode, and electrode 30 is an indium-tin-oxide electrode (ITO) that has been cleaned with a plasma treatment, external quantum efficiencies in the range of 1.2–1.5% at 100–1000 $cd/m^2$ can be achieved. Distributing the bipyridine complex of ruthenium in a polymer matrix, such as PMMA, prior to spin-casting can result in an improved film quality, which, in return, decreases the leakage current during device operation. External quantum efficiencies of 2–2.5% at a light output of 200 $cd/m^2$ can be observed when tris(2,2'-bipyridyl) ruthenium(II) hexafluorophosphate is blended with PMMA or PC.

The wavelength of maximum emission from the light-emitting device can be between 600 and 700 nm. The intensity of the maximum emission decreases with time. The drop to one half of the maximum emission is related to the lifespan of the device. The time to drop to one half of the maximum emission intensity (half-life or $t_{1/2}$) can be at least 100 hours. Under a 50% duty cycle at 5 V and 1 kHz, half-lives of around 500–1100 hours continuous operation at luminance levels in the range of 200–350 $cd/m^2$ can be obtained.

The external quantum efficiency ("eqe") of the light-emitting device can be greater than 0.5 percent. In certain embodiments, the external quantum efficiency can be about 1 percent. An optical power meter can be used to measure light output (e.g., a Newport 1830C optical power meter). By dividing by a factor of between 25 and 36, the optical power output, measured in nanowatts, can be converted to luminance ($cd/m^2$). The conversion factor can be determined for the particular experimental set-up in use by comparing power output measurements to direct luminance measurements. Luminance values can be determined using a Graseby Optronics (Orlando, Fla.) S370 optometer.

The external quantum efficiency is defined as the ratio of emitted light intensity to current flow (e.g., photons out/ electrons in). Calculation of external quantum efficiency values has been described previously by Lyons et al., J. Am. Chem. Soc. 120:12100–12107 (1998), which is incorporated herein in its entirety. A correction factor is generated for calibration. Briefly, light emission from the front face of the device is taken to be Lambertian, and the light is collected over emission angles 0 to 28.3 degrees by a photodiode. The external efficiency, $\eta ext(\%)$, is calculated as follows:

$\eta ext(\%) = (P/hv)/(I/e)$ where P=the corrected power output;
h=Planck's constant;
v=the center frequency of the emitted light;

I=the current; and
e=the elementary charge.

The solid layer can be deposited on the surface of one of the electrodes by spin coating, dip coating, vapor deposition, or other thin film deposition methods. In certain embodiments, a solution of the metal complex in a solvent is deposited by spin coating on a surface of an electrode. For example, a pyridine solution of a ruthenium hexafluorophosphate salt can be deposited by spin coating on an ITO electrode. The resulting solid layer can have a thickness of between about 200 and 2000 Angstroms (e.g., between about 500 and 1500 Angstroms). The device can range from about 2 mm×2 mm to about 20 mm×20 mm in size. Larger devices can also be made.

The second electrode can be sandwiched, sputtered, or evaporated onto the exposed surface of the solid layer. One or both of the electrodes can be patterned. The electrodes of the device are connected to a voltage source by electrically conductive pathways. Upon application of the voltage, light is generated from the device.

In certain embodiments, an increased voltage (i.e., a 1 to 6 V increase over the operating voltage) can be applied for a short duration of time (e.g., less than 10 seconds) prior to holding the device at the operating voltage to decrease charging time. By decreasing charging time, a higher luminance can be more rapidly achieved from a light-emitting device. Counter-ion redistribution can be slow at a lower bias, which can lead to longer charging times which can be reduced by employing a higher voltage pulse.

Additives can be included in the solid layer. The additives can be a polymer, such as a polyethylene oxide (e.g., polyethylene glycol or methyl terminated polyethylene oxide), an inorganic nanoparticle (e.g., 10–100 Angstrom silica particles), a salt (e.g., lithium triflate), or a redox active material that can facilitate charge transfer through the film or that can accept the excited state and emit light of a different wavelength (e.g., a lumophore). In addition, the interface between each electrode and the solid layer can be modified, for example, by depositing a thin polymer coating (e.g., polyethylene imine) on the electrode surface. The device can be encapsulated in a polymer matrix that is resistant to oxygen or moisture permeation to increase the half-life of the light-emitting device.

Without further elaboration, it is believed that one skilled in the art can, based on the above disclosure and the examples below, utilize the present invention to its fullest extent. The following examples are to be construed as merely illustrative of how one skilled in the art can practice the invention and do not limit the remainder of the disclosure in any way.

EXAMPLES $(Ru(bpy)_3)(PF_6)_2$ was prepared from $Ru(bpy)_3Cl_2 \cdot 6H_2O$ (Aldrich) by ion exchange with an excess of $NH_4PF_6$ (Aldrich) in Milli-Q water, obtained from a Milli-Q water purification system (Millipore Corp.). The $(Ru(bpy)_3)(PF_6)_2$ was twice recrystallized by dissolving it in acetone and then precipitating it by adding Milli-Q water. The resulting material was dried under vacuum overnight at 80° C. and stored under a nitrogen atmosphere.

Patterned ITO glass slides were cleaned in a MICRO 90™ solution (1.5%) in a sonicator for 15 minutes, followed by a 15 minute sonification in Milli-Q water and in 2-propanol, respectively. Between each cleaning step, the slides were rinsed with Milli-Q water extensively. Prior to spin-coating, the glass slides were plasma-cleaned for 5 minutes in a Harrick Plasma Cleaner PDC-32 G plasma cleaner in air.

All solid layer films were prepared by spin coating at 1500 rpm for 30 seconds under a nitrogen atmosphere. Spinning solutions for the blend devices were prepared in the following way. For the PMMA blends, two stock solutions of 40 mg/mL $(Ru(bpy)_3)(PF_6)_2$ in acetonitrile and 25 mg/mL PMMA in acetonitrile were prepared. The concentrations in the stock solutions were adjusted to give a final film thickness of 1200 Angstroms when spun at 1500 rpm. Blend solutions of $(Ru(bpy)_3)(PF_6)_2$ with PMMA were prepared by mixing the two stock solutions at a certain ratio. All blend films had a final thickness of 1200 Angstroms when spun at 1500 rpm. This method allows the preparation of films with varying PMMA content while keeping the final film thickness constant. The PS and PC blends were made the same way as described above using stock solutions of 29 mg/mL PS in pyridine, 27 mg/mL PC in pyridine and 50 mg/mL $(Ru(bpy)_3)(PF_6)_2$ in pyridine, respectively, to achieve final film thicknesses of 1200 Angstroms. Polymer-free $(Ru(bpy)_3)(PF_6)_2$ devices were prepared by using the $(Ru(bpy)_3)(PF_6)_2$ stock solution in acetonitrile. The spun films were dried in a nitrogen atmosphere under vacuum for one hour at room temperature followed by 2 hours at 120° C. in a vacuum oven. They were then cooled over night in the vacuum oven.

A 2000 Angstrom thick aluminum electrode was evaporated on top of the films in a vacuum chamber at a pressure of $1.0–3.0\times10^{-6}$ torr at a rate of 10 Angstroms/s. In addition, PMMA blend devices were prepared with Ag as the cathode material. Because Ag has a higher heat of condensation than Al, the evaporation was done at a lower rate and divided into two consecutive runs. First, a 400 Angstrom thick Ag layer was evaporated at 3 Angstroms/s. The system was then allowed to cool for 20 minutes, before a second Ag layer of 1500 Angstroms at 5 Angstroms/s was evaporated. The active area of each light-emitting cell was 2 mm×3 mm. The devices were stored and tested in a glove box under a nitrogen atmosphere immediately after the metal evaporation.

All devices were tested under a DC voltage and under a duty cycle mode (pulsed voltage). Because the duty cycle mode is a superposition of a DC and an AC voltage, the current is composed of a DC and an AC component. When calculating the efficiency of a device operating under a duty cycle mode, the two components of the current have to be taken into account. The AC component of the current is the result of the device also acting as a capacitor. During each voltage cycle, the AC current is charging and discharging the two electrodes and no current is actually passing through the $(Ru(bpy)_3)(PF_6)_2$ layer. In contrast, the DC component of the current is the current that is passing through the $(Ru(bpy)_3)(PF_6)_2$ layer. Therefore, the external quantum efficiency of a device operated in the duty cycle mode can be calculated based on the DC component of the current only.

The impedance analysis was performed on an HP4284A LCR meter in the frequency range from 1 MHz to 20 Hz at 0 V bias with a 5 mV amplitude. Voltage, current and light output were measured using an HP3245A universal source, an HP34401A multi-meter and a Newport 1830-C optical power meter controlled by LabView (National Instruments). The electro-luminescence emission of all devices was red-orange, centered at around 630 nm.

In the experimental setup, a calibrated photo diode is placed in front of the device at a fixed distance (10.5 mm). In this configuration, the light emitted at an angle θ between 0 degrees and 28.3 degrees in the forward direction is collected by the photodiode. The relative amount of light collected by the diode can be determined by assuming a Lambertian emission of the light source. See N. C. Greenham et al. Adv. Mater. 6:491–494 (1994), which is incorporated herein by reference in its entirety. With this assumption, the diode collects ca. 22% of the total light emitted in forward direction.

Figure 3:
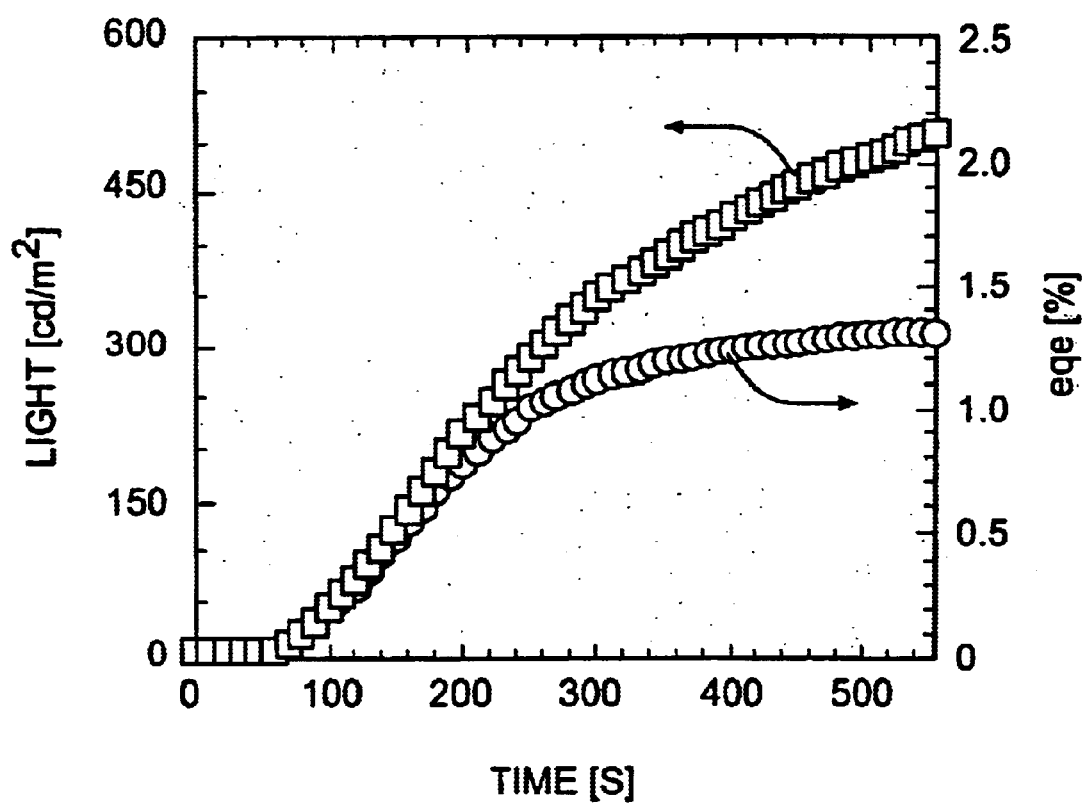
FIG. 3 is a graph depicting the evolution of the light emission and external quantum efficiency (eqe) for a $(Ru(bpy)_3)(PF_6)_2$ device after a 3 V bias has been applied.
Figure 4:
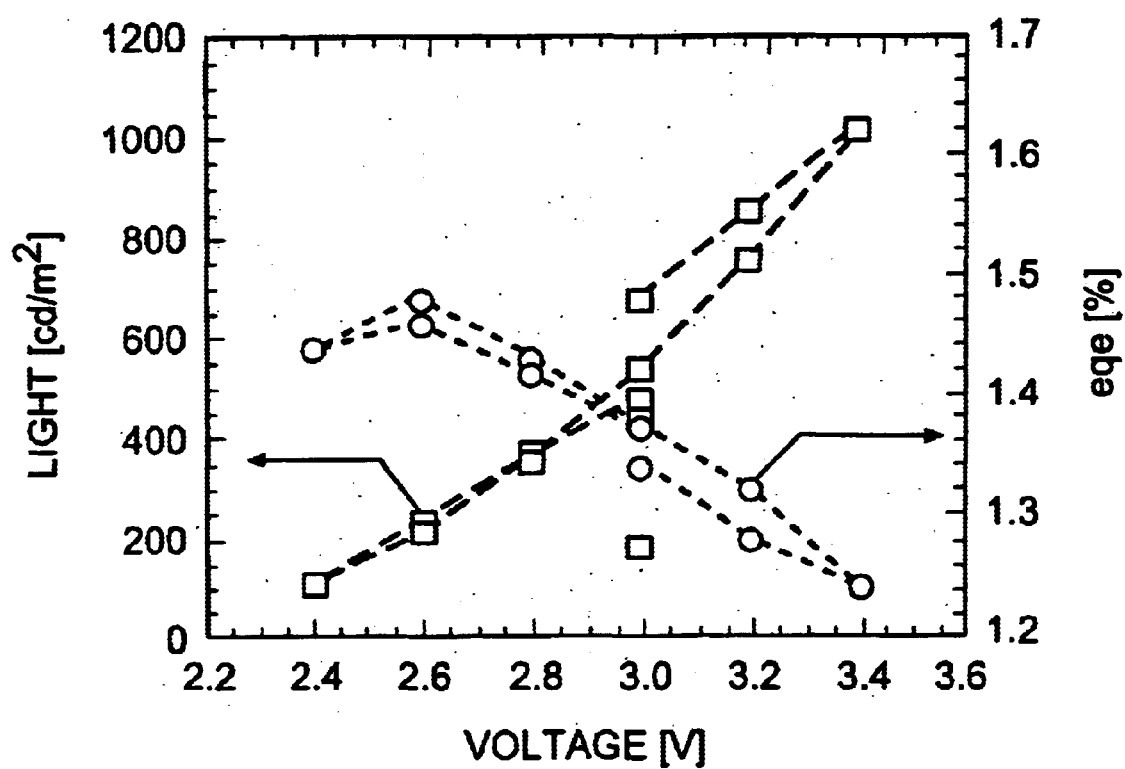
FIG. 4 is a graph depicting the light output and external quantum efficiency at various operating voltages for a $(Ru(bpy)_3)(PF_6)_2$ device.

Devices based on solid layers of $(Ru(bpy)_3)(PF_6)_2$ in the absence of polymer were tested. FIG. 3 shows the light-emission and external quantum efficiency (eqe) obtained for an ITO/$(Ru(bpy)_3)(PF_6)_2$/Al device after a 3 V bias has been applied. An external quantum efficiency of ca. 1.4% was achieved at 3 V. After the light output reached a steady state value at 3 V, the voltage was ramped in 0.2 V steps down to 2.4 V, up to 3.4 V and back to 3 V. The efficiency and light output of the device as the operating voltage varied is shown in FIG. 4. The driving voltage was maintained for about one minute at each voltage before a current and light reading was taken. Below 2.4 V the light output and efficiency dropped dramatically, however, light emission was observed down to 2.0 V (data not shown). The difference in the light output and efficiency for the voltage up-ramp and voltage down-ramp was a result of the device not being completely in a steady state condition at each voltage. The external quantum efficiency varied little in the range of operation between 2.4 and 3.4 V with values of 1.45%–1.25%. The light output in this voltage range varied from about 100 to 1000 cd/m$^2$.

Figure 5:
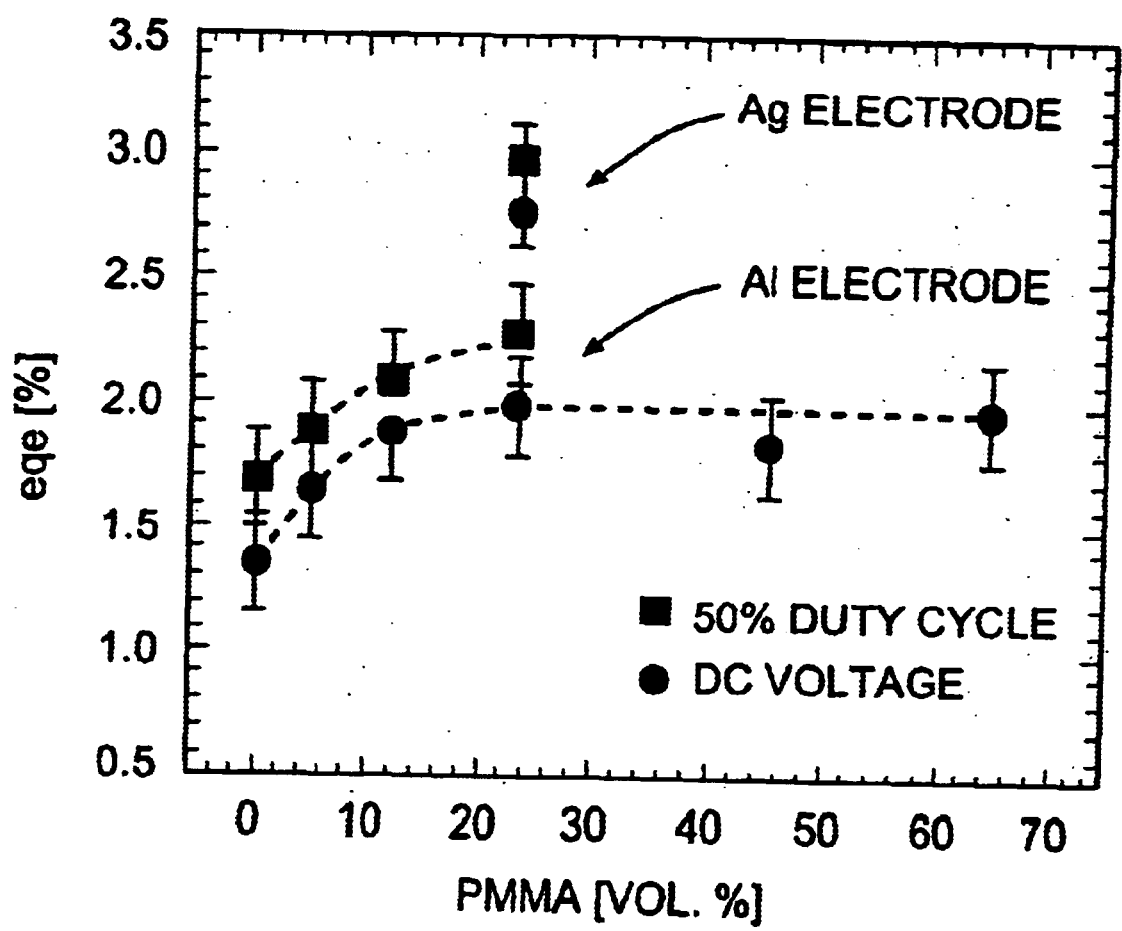
FIG. 5 is a graph depicting external quantum efficiency of $(Ru(bpy)_3)(PF_6)_2$ blend devices as the volume percentage of PMMA in the blend varied under DC voltage or a duty cycle.

The effects of distributing the non-polymeric metal complex in a polymer matrix were explored. Increased device efficiency resulting from blending with a polymer and employment of a silver electrode were observed. Light-emitting devices from blends of $(Ru(bpy)_3)(PF_6)_2$ with poly(methyl methacrylate) (PMMA) were prepared. FIG. 5 shows the external quantum efficiency of ITO/$(Ru(bpy)_3)(PF_6)_2$-PMMA/Al devices and ITO/$(Ru(bpy)_3)(PF_6)_2$-PMMA/Ag devices fabricated with different volume percentage of PMMA. All devices were tested under a DC voltage and under a duty cycle mode (pulsed voltage).

Referring to FIG. 5, device efficiency increases with increasing PMMA content for both DC voltage and 50% duty cycle operation modes. For both operation modes, the device efficiency was found to increase as the PMMA content increases. However, in both cases, the efficiency reached its maximum value at approximately 25 volume percent PMMA. The DC efficiencies of devices with 0 to 23 volume percent PMMA were measured at 3 V after the devices reached a steady state light output. At a PMMA content of 45 and 65 volume percent, the film resistance of the devices increased to such an extent that these devices were operated at 4 and 9 V, respectively. At 23 volume percent PMMA, the external quantum efficiency reached around 2% for the DC operation at 3 V. In comparison to the DC mode, all devices showed higher efficiencies when operated under a 50% duty cycle mode at 5 V and 1 kHz after the devices were first operated at 3 V DC until a steady state light output was reached. Under the duty cycle mode, the efficiency reached a maximum value of approximately 2–2.5% at 23 volume percent PMMA. When silver is used as an electrode material instead of aluminum, a further increase for the efficiency is achieved. With an silver electrode, efficiencies in the range of 2.7–3.1% have been achieved for blend devices with 23 volume percent PMMA. Most devices without PMMA additions were shorted after the Ag electrode was evaporated onto the film. The PMMA makes the solid layer more robust to electrode deposition.

Figure 6:
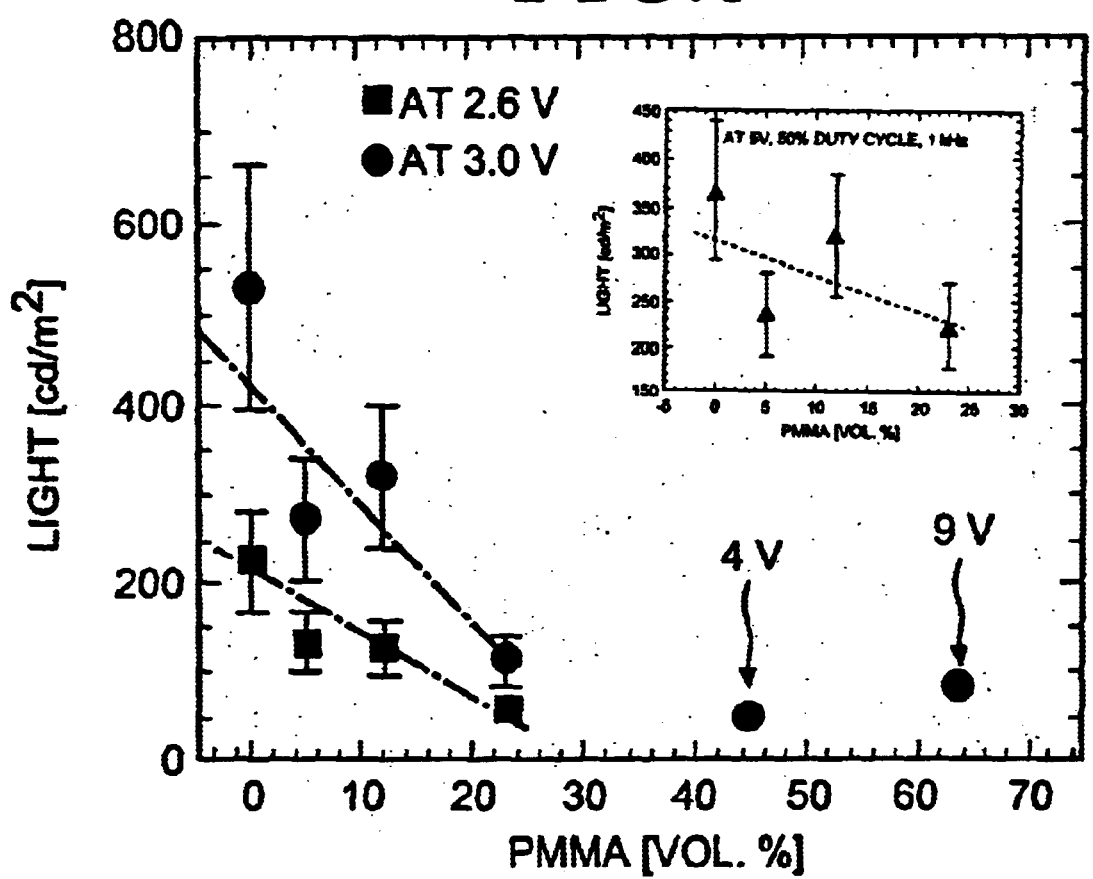
FIG. 6 is a graph depicting light emission of $(Ru(bpy)_3)(PF_6)_2$ blend devices as the volume percentage of PMMA is varied.

High brightness of the device at low operating voltage is depicted in FIG. 6, which is a graph depicting the light output of ITO/$(Ru(bpy)_3)(PF_6)_2$-PMMA/Al devices with varying PMMA concentration at different operating voltages. Devices with a PMMA content up to 23 volume percent PMMA were first operated at 3 V until a steady state light output was reached. The devices were then operated at voltages as low as 2.6 V. The brightness of the devices at 2.6 and 3 V ranged from 50 to 400 cd/m$^2$, allowing devices with a low volume fraction of PMMA to be operated at voltage levels comparable to those used to drive polymer-free (Ru(bpy)$_3$)(PF$_6$)$_2$ devices. The time to reach a steady state light output of the PMMA blend devices at 3 V increased by a factor of 2–3 compared to a polymer-free (Ru(bpy)$_3$)(PF$_6$)$_2$ device. The inset in FIG. 6 shows the light emission for devices with 0–23 volume percent PMMA operated at a 50% duty cycle at 5 V and 1 kHz. Although the time average of the applied voltage is 2.5 V, the time average of the light output is higher than devices operated at 2.6 V DC. In addition, the drop in light emission as the PMMA content increases is not as large under the duty cycle operation. For the 12 and 23 volume percent PMMA devices, the light emission under a duty cycle exceeded the light emission at 3 V DC. Brightnesses of 200 to 350 cd/m$^2$ were achieved.

Impedance analysis of the blend devices at 0 V bias showed a single semicircle in the complex plane plot. This result indicates that the devices can be represented by an equivalent electric circuit of a capacitor and resistor in parallel, where the film resistance is determined from the diameter of the semicircle. No interfacial capacitance was observed, suggesting a very low ion-mobility in the device. Resistance of the devices increased with increasing PMMA content and even small amounts of PMMA significantly increased the film resistance. At approximately 23 volume percent PMMA, the film resistance reached 0.5–2 MΩ compared to 1–1.5 kΩ for a polymer-free device.

Figure 7:
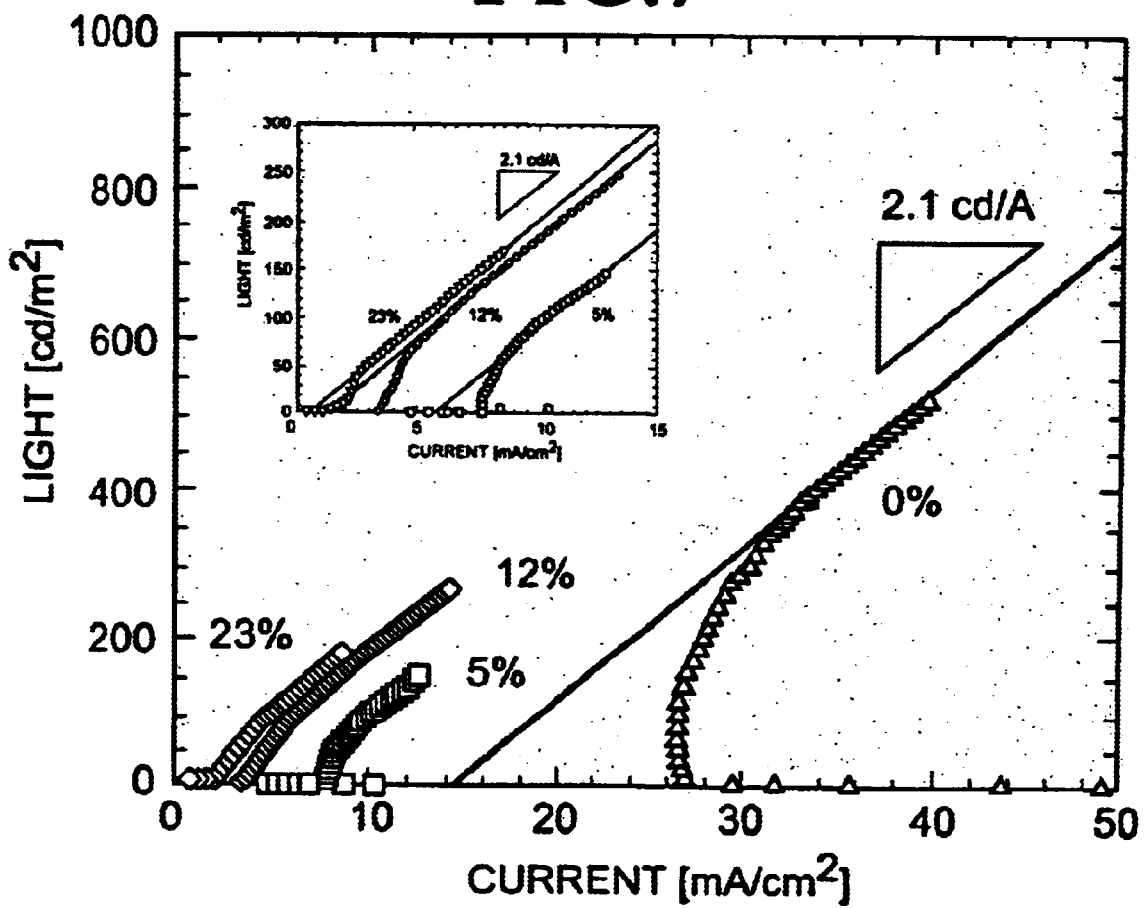
FIG. 7 is a graph depicting light emission as current varies for 0, 5, 12, and 23 volume percent PMMA devices during the transient time to reach a steady state emission at 3 V.

FIG. 7 shows the change in the light emission for devices with 0 to 23 volume percent PMMA during the transient time to reach steady state after a 3 V bias has been applied as current changes. The inset shows an enlarged section of the graph for smaller current and light output. At time 0, after a 3 V bias has been applied, all devices already conducted some current without emitting light. After some time, the light emission started and the light and current increased. As the light emission approached a steady state value, a linear relation between the current and light emission was observed. All curves show the same slope of approximately 2.1 cd/A in the linear regime. The 2.1 cd/A represents an efficiency that translates to around 2.1% external quantum efficiency. However, this is not the true external quantum efficiency, for example, as shown in FIG. 5. The true efficiency at a given point on a curve is determined by connecting the point with the origin of the graph and taking the slope of this line. When the linear regime of each curve is extrapolated to zero light output this line intercepts the current-axis at a value greater than zero. With increasing PMMA content, the curves move closer to the origin of the graph and the intercept becomes smaller. This residual current at zero light output can be viewed as a leakage current going through the device during operation in the linear regime. At 23 volume percent PMMA, the intercept approaches 0 mA/cm$^2$ and therefore the 2.1 cd/A determined from the slope becomes almost identical to the measured true efficiency as shown in FIG. 5. When silver is used as to form the first electrode and ITO is used to form the second electrode, no leakage current was observed for a device with 25 volume percent PMMA.

Figure 8:
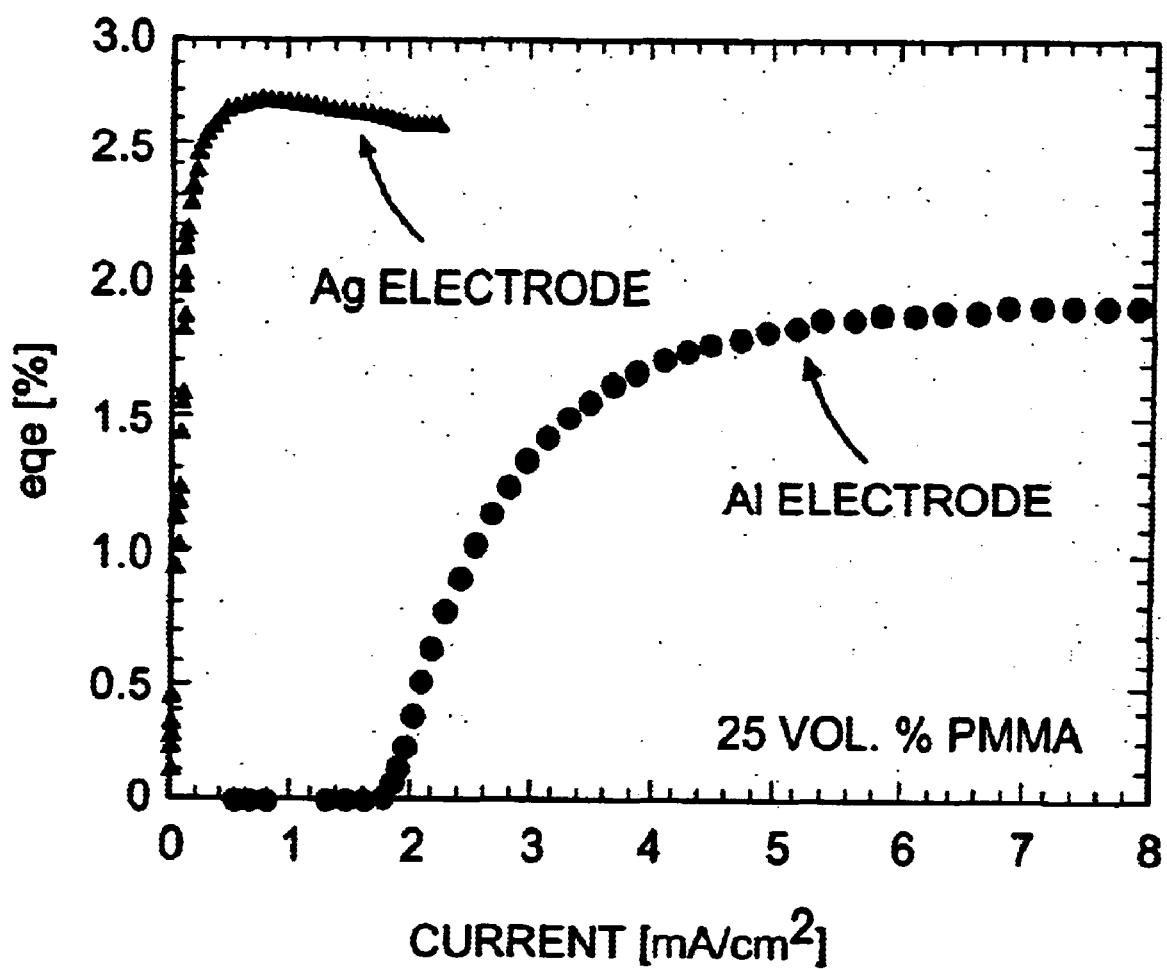
FIG. 8 is a graph depicting external quantum efficiency as a function of the current density for devices with 25 volume percent PMMA and either an aluminum electrode or a silver electrode.

The evolution of the external quantum efficiency as a function of the current density for devices with 25 volume percent PMMA and a silver electrode or an aluminum electrode after a constant voltage has been applied was examined. The aluminum-electrode device was operated at 3.5 V and the silver-electrode device was operated at 3 V. The results are summarized in FIG. 8, which shows that the device with the aluminum electrode operated at 3.5 V reached its maximum efficiency at a current density of around 8 mA/cm$^2$ and the device with the silver electrode operated at 3.0 V reached its maximum efficiency already at less than 1 mA/cm$^2$. The silver-electrode device achieved an efficiency in the range of 2.5–3.0%.

Figure 9A:
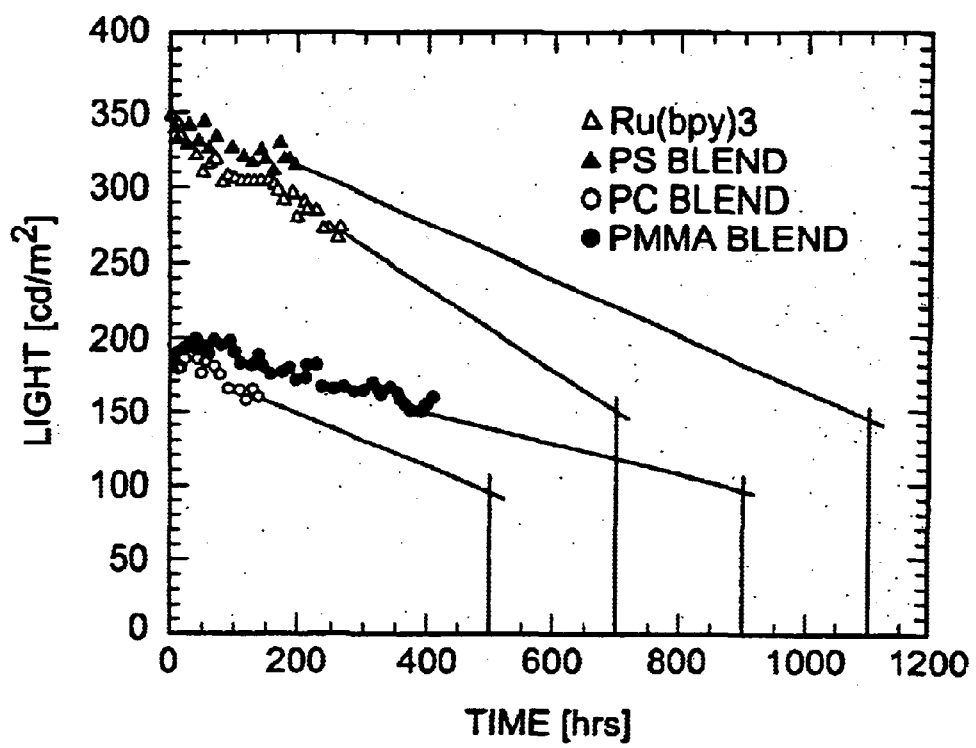
FIGS. 9A and 9B are graphs depicting the light emission or external quantum efficiency over time of polymer-free devices and devices including PMMA, PC, and PS.
Figure 9B:
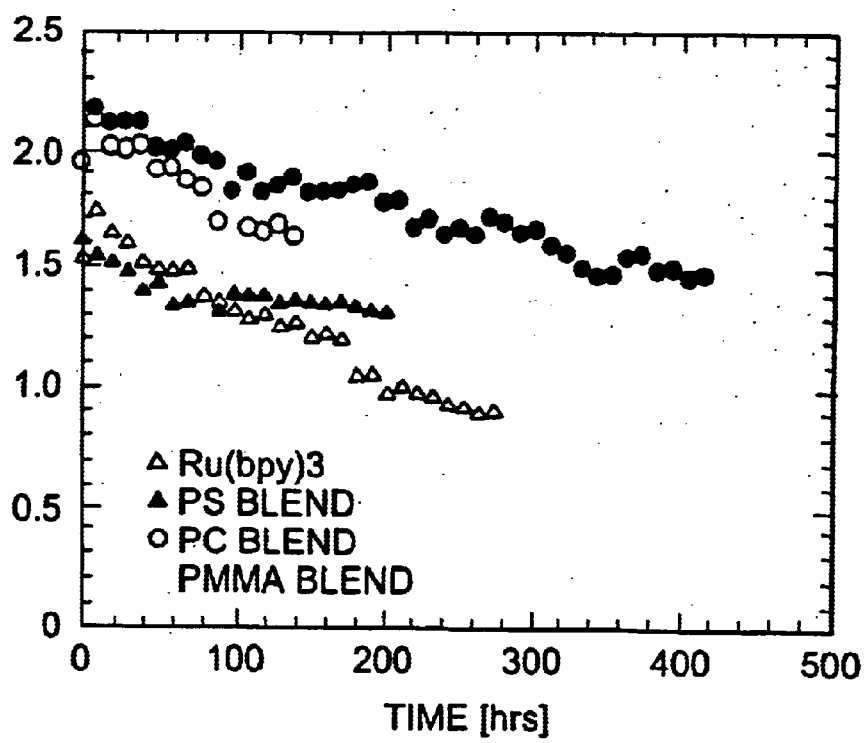

Improved half-life under duty cycle operation was observed when operated under a 50% duty cycle at 5 V and 1 kHz. Polymer-free devices and blend devices with PMMA, PC, and PS were tested. The blend devices contain about 25 volume percent of polymer (either PS, PC or PMMA). Referring to FIG. 9A, the light emission over time for the various (Ru(bpy)$_3$)(PF$_6$)$_2$ blend devices and a pristine device when operated under a duty cycle. Based on extrapolation, the devices operated under a duty cycle have half-lives of about 1100, 700, 900 and 500 hours for the PS, polymer-free, PMMA and PC devices, respectively. The change in external quantum efficiency over time under the duty cycle is depicted in FIG. 9B. The highest initial efficiency in the range of 2–2.5% was observed in the PC and PMMA devices.

Figure 10:
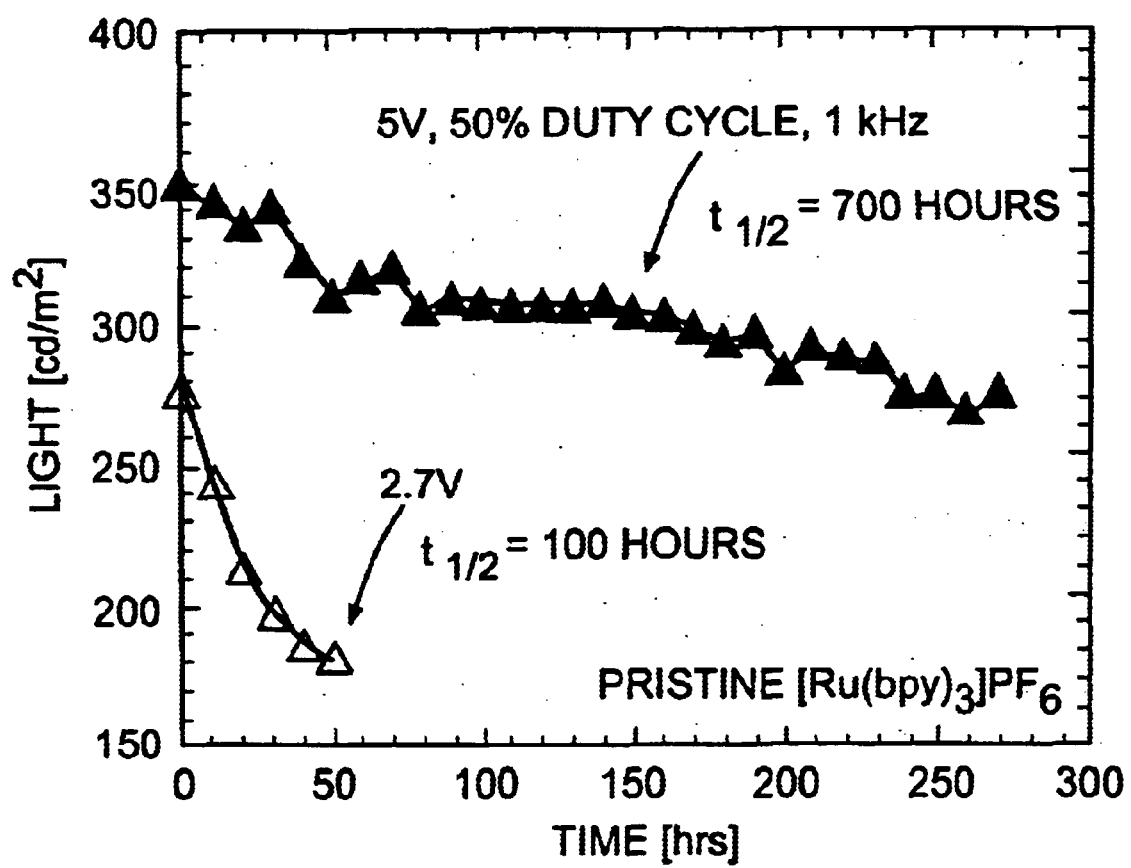
FIG. 10 is a graph depicting light emission of $(Ru(bpy)_3)(PF_6)_2$ devices over time under DC operation and duty cycle operation.

Referring to FIG. 10, the change in light intensity of a polymer-free (Ru(bpy)$_3$)(PF$_6$)$_2$ device operated under a DC voltage and a duty cycle over time is shown. The DC voltage was set to 2.7 V to achieve a similar initial light output as the light output of the duty cycle mode. For the operation at 5 V with a 50% duty cycle at 1 kHz, the half-life was around 700 hours. For the operation at 2.7 V DC, the half-life was around 100 hours.

Figure 11A:
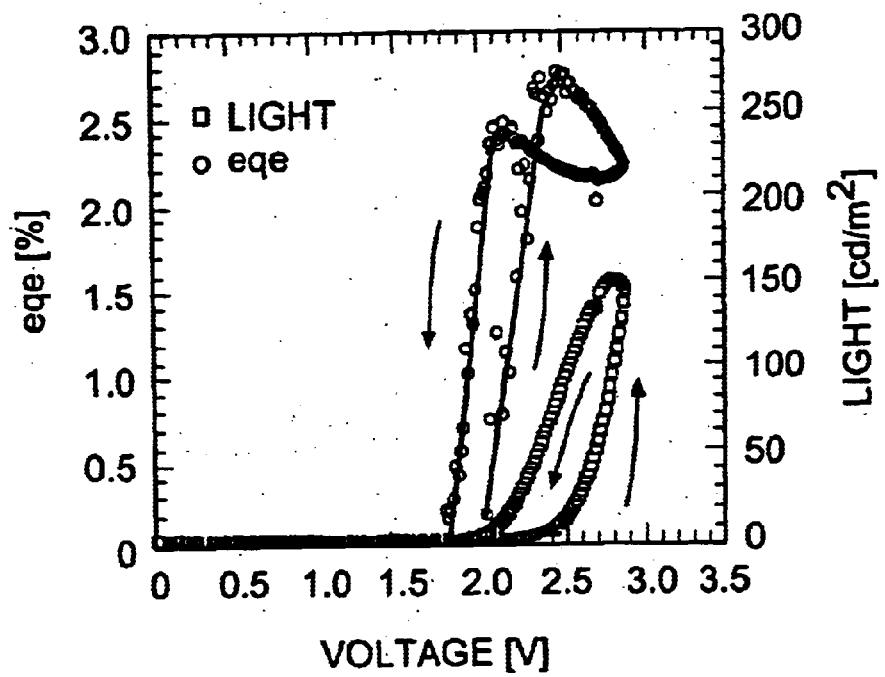
FIGS. 11A and 11B are graphs depicting the light emission and efficiency at various operating voltages and duty cycles, respectively.
Figure 11B:
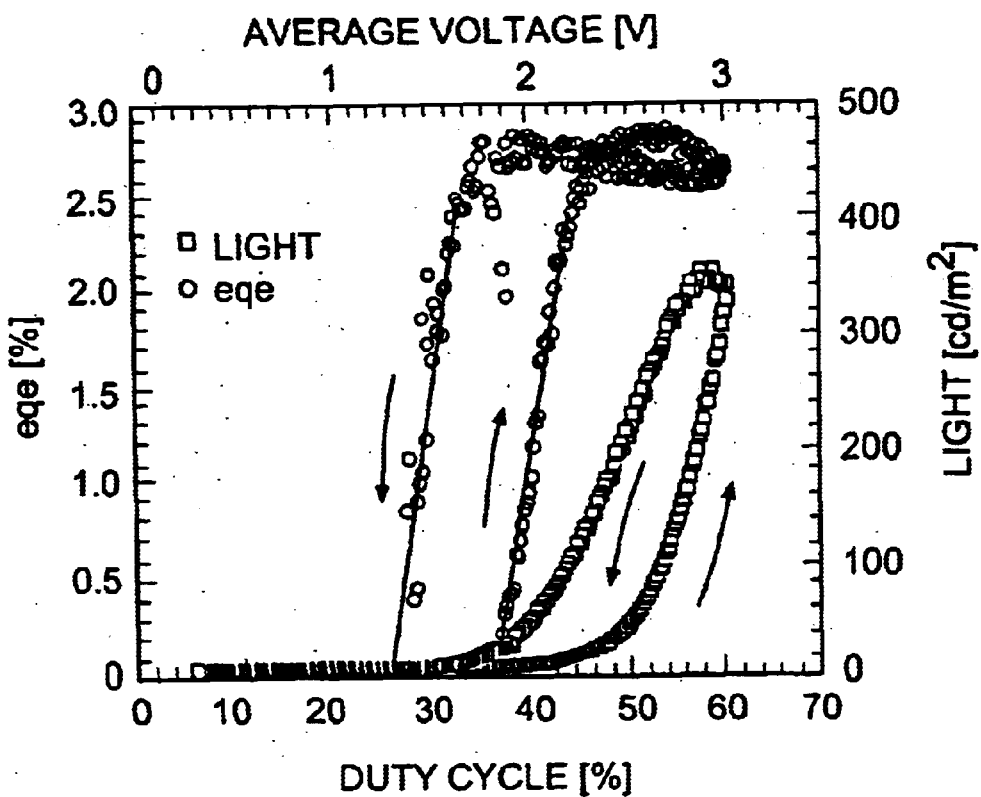

FIGS. 11A and 11B depict the light emission and efficiency for devices with 25 volume percent PMMA and a silver electrode operated under various DC voltages and duty cycles. In FIG. 11A, the DC voltage was ramped from 0 to 3 V and back to 0 V at 1 V/h. In FIG. 11B, the duty cycle was ramped from 5 to 60% while the maximum voltage was held at 5 V at 1 kHz. The duty cycle was ramped at a rate so that the average voltage applied to the device was ramped from 0.1 to 3 V and back to 0.1 V at a rate of 1 V/h. When operated under a duty cycle, the device had a brightness of around 300 cd/m$^2$ at 3 V average voltage, which was substantially higher than the brightness for the DC operation at 3 V, which was around 150 cd/m$^2$. Under a duty cycle operation a higher brightness can be achieved than at a DC operation at a similar voltage. In addition, the efficiency of the device under a duty cycle recovers its maximum value entirely during the down ramp of the duty cycle. A higher stability and light output can be achieved under the duty cycle in comparison to a DC operation.

Figure 12A:
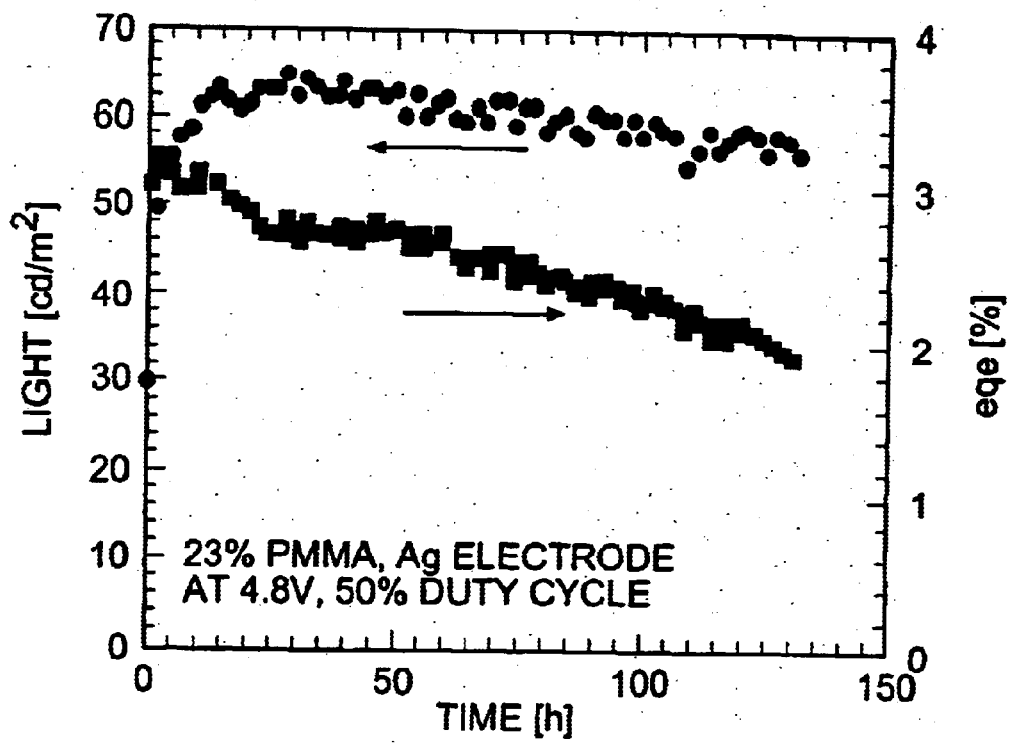
FIGS. 12A and 12B are graphs depicting light emission over time of devices with 23 volume percent PMMA and a silver electrode operated at 4.8 V with a 50% duty cycle at 1 kHz and at 5 V with a 44 and 45% duty cycle at 1 kHz.
Figure 12B:
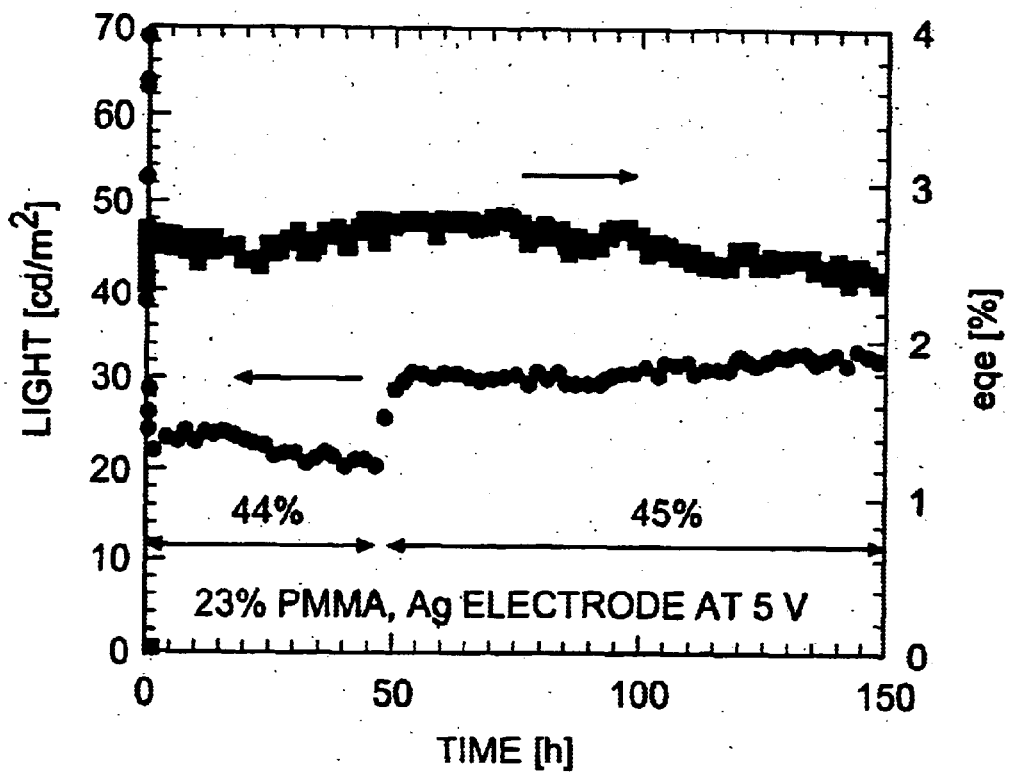

Devices formed with a silver electrode and an ITO electrode require a lower average voltage than devices with an aluminum electrode when operated under a duty cycle. Referring to FIG. 12A, the light output and efficiency over time for a device with an average voltage of 2.4 V operated at 4.8 V with a 50% duty cycle at 1 kHz was stable. After almost 150 hours, the light emission had decreased by around 10% of its maximum value. However, the efficiency of the device dropped in the same period from 3% to below 2%. Referring to FIG. 12B, the stability was increased by operating the device at an average voltage of 2.2 and 2.25 V. This average voltage was achieved by stetting the peak voltage to 5 V at 1 kHz and changing the duty cycle to a 44 and 45%, respectively. In this case, the light emission did not decrease after 150 hours and the efficiency dropped only to around 2.5% in the same period.

Devices were prepared following the method described above using a chemically modified (Ru(bpy)$_3$)(PF$_6$)$_2$, the di-tert-butyl derivative shown below.

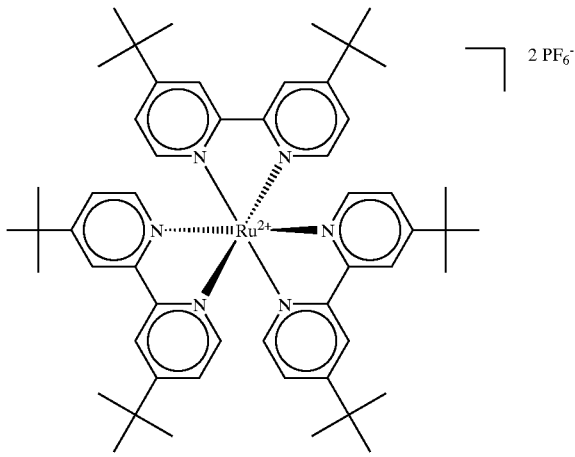

Figure 13A:
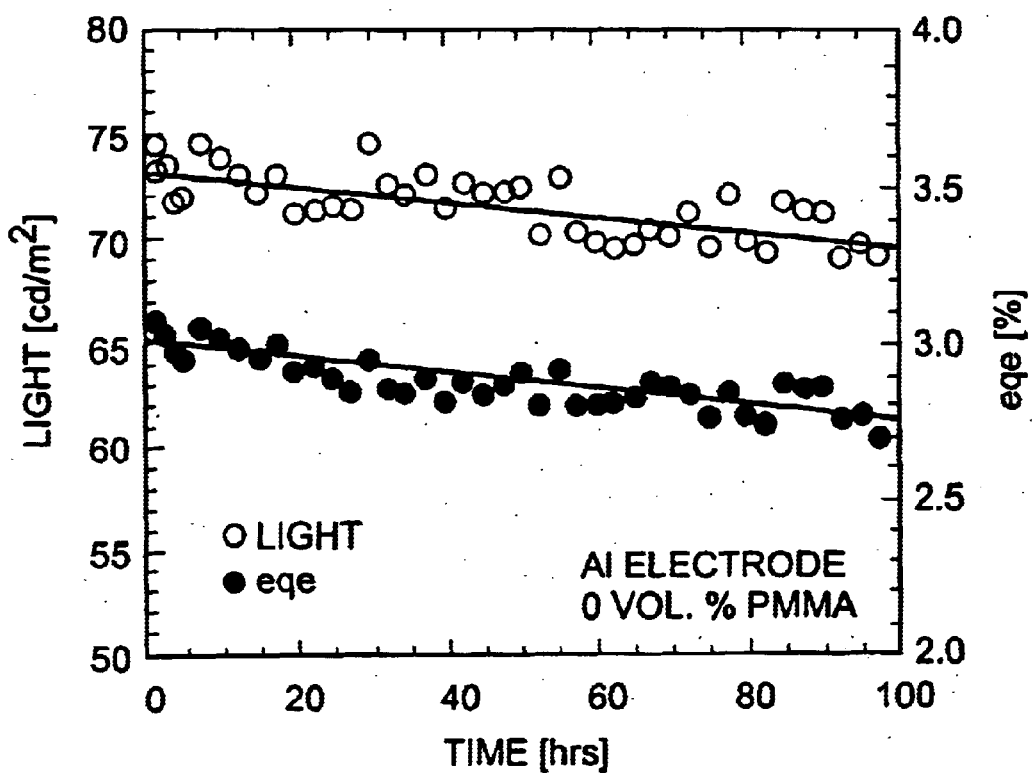
FIGS. 13A and 13B are graphs depicting the light emission and efficiency over time of devices containing a chemically-modified $(Ru(bpy)_3)(PF_6)_2$.
Figure 13B:
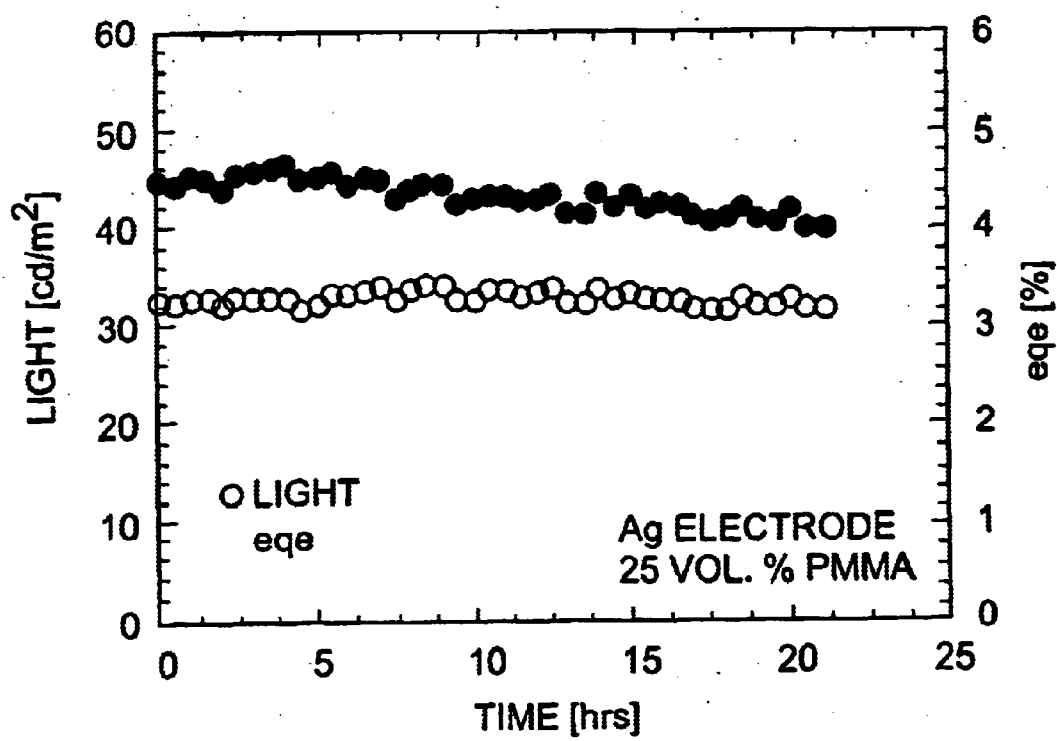

The light emission and efficiency of devices containing the tert-butyl derivative Ru(bpy)$_3^{2+}$ compound operated at 5V with a 50% duty cycle at 1 kHz without PMMA using an aluminum electrode and an ITO electrode over 100 hours is shown in FIG. 13A. The initial light output and external quantum efficiency of the device were approximately 70 cd/m$^2$ and 3%, respectively. The external quantum efficiency of this device is about twice as high as a comparable device with (Ru(bpy)$_3$)(PF$_6$)$_2$ and an aluminum electrode. When a device was prepared with silver electrode and PMMA, a higher efficiency was achieved. Referring to FIG. 13B, the light emission and external quantum efficiency of a device containing the tert-butyl derivative Ru(bpy)$_3^{2+}$ compound with 25 volume percent PMMA and a silver electrode was around 4.5% efficiency at 30 cd/m$^2$.

Other embodiments are within the claims.

What is claimed is:

1. A solid state electrochemical light-emitting device comprising:
   a solid layer including a non-polymeric metal complex distributed in a polymer matrix, the solid layer having a first surface and a second surface;
   a first electrode in contact with the first surface; and
   a second electrode in contact with the second surface.

2. The device of claim 1, wherein the non-polymeric metal complex is a transition metal complex.

3. The device of claim 1, wherein the device has an external efficiency of at least 1.0 percent at a luminance of at least 100 cd/m$^2$.

4. The device of claim 1, wherein the device has an external efficiency of at least 4.0 percent at a luminance of at least 30 cd/m$^2$.

5. The device of claim 1, wherein the device has a time for an intensity of the device to decrease to one-half of a maximum intensity under a 50% duty cycle at 5 V and 1 kHz of at least 200 hours.

6. The device of claim 1, wherein the device has a time for an intensity of the device to decrease to one-half of a maximum intensity under a 50% duty cycle at 5 V and 1 kHz of at least 400 hours.

7. The device of claim 1, wherein the non-polymeric metal complex is a ruthenium complex.

8. The device of claim 7, wherein the metal complex is a hexafluorophosphate salt of a ruthenium bipyridine complex.

9. The device of claim 8, wherein the second electrode is selected from a group consisting of indium tin oxide, silver, gold, platinum, palladium, and polypyrrole.

10. The device of claim 1, wherein the non-polymeric metal complex is a metal bipyridine complex.

11. The device of claim 10, wherein the bipyridine has a C1–C18 alkyl subtituent.

12. The device of claim 10, wherein the bipyridine has a tert-butyl substituent.

13. The device of claim 1, wherein the first electrode is selected from a group consisting of indium tin oxide, aluminum, silver, gold, platinum, and palladium.

14. The device of claim 1, wherein the first electrode is silver and the second electrode is indium tin oxide.

15. The device of claim 1, wherein the polymer matrix includes a polymethylmethacrylate, a polystyrene or a polycarbonate.

16. A solid state electrochemical light-emitting device comprising:
   a solid layer including a non-polymeric metal bipyridine complex distributed in a polymer matrix,
   an indium tin oxide electrode in contact with a first surface of the solid layer; and
   a silver electrode in contact with a second surface of the solid layer.

17. The device of claim 16, wherein the device has a time for an intensity of the device to decrease to one-half of a maximum intensity under a 50% duty cycle at 5 V and 1 kHz of at least 200 hours.

18. The device of claim 16, wherein the device has an external efficiency of at least 1.0 percent at a luminance of at least 100 cd/m$^2$.

19. A solid state light-emitting circuit comprising:
   a solid state electrochemical light-emitting device comprising:
   (1) a solid layer including a metal complex, the solid layer having a first surface and a second surface;
   (2) a first electrode in contact with the first surface; and
   (3) a second electrode in contact with the second surface; and
   a driver comprising an AC voltage waveform generator configured to apply an AC voltage waveform across first electrode and the second electrode, whereby the solid state light-emitting device emits light.

20. The circuit of claim 19, wherein the driver further comprises a DC voltage generator configured to apply a DC voltage across first electrode and the second electrode.

21. The circuit of claim 19, wherein the metal complex is a non-polymeric transition metal complex.

22. The circuit of claim 19, wherein the device has an external efficiency of at least 1.0 percent at a luminance of at least 100 cd/m$^2$.

23. The circuit of claim 19, wherein the device has a time for an intensity of the device to decrease to one-half of a maximum intensity under a 50% duty cycle at 5 V and 1 kHz of at least 200 hours.

24. The circuit of claim 19, wherein the metal complex is a non-polymeric ruthenium complex.

25. The circuit of claim 19, wherein the metal complex is a hexafluorophosphate salt of a non-polymeric ruthenium bipyridine complex.

26. The circuit of claim 19, wherein the first electrode is selected from a group consisting of indium tin oxide, aluminum, silver, gold, platinum, and palladium.

27. The circuit of claim 26, wherein the second electrode is selected from a group consisting of indium tin oxide, silver, gold, platinum, palladium, and polypyrrole.

28. The circuit of claim 19, wherein the first electrode is silver and the second electrode is indium tin oxide.

29. The circuit of claim 19, wherein the polymer matrix includes a polymethylmethacrylate, a polystyrene or a polycarbonate.

30. A method of generating light comprising:

applying a light-generating potential across a first electrode and a second electrode of a solid state electrochemical light-emitting device including a solid layer including a non-polymeric metal complex distributed in a polymer matrix, the solid layer having a first surface and a second surface, the first electrode contacting the first surface, and the second electrode contacting with the second surface; and generating light from the device having a luminance of at least 30 $cd/m^2$.

31. The method of claim 30, wherein applying a light-generating potential comprises applying a DC voltage across the first electrode and the second electrode for a predetermined period of time, and applying an AC voltage waveform across the first electrode and the second electrode after the predetermined period of time.

32. The method of claim 30, wherein the metal complex is a non-polymeric transition metal complex.

33. The method of claim 30, wherein the device has an external efficiency of at least 1.0 percent at a luminance of at least 100 $cd/m^2$.

34. The method of claim 30, wherein the metal complex is a non-polymeric ruthenium complex.

35. The method of claim 30, wherein the metal complex is a hexafluorophosphate salt of a non-polymeric ruthenium bipyridine complex.

36. The method of claim 30, wherein the first electrode is selected from a group consisting of indium tin oxide, aluminum, silver, gold, platinum, and palladium.

37. The method of claim 36, wherein the second electrode is selected from a group consisting of indium tin oxide, silver, gold, platinum, palladium, and polypyrrole.

38. The method of claim 30, wherein the first electrode is silver and the second electrode is indium tin oxide.

39. The method of claim 30, wherein the AC voltage waveform is a square wave.

40. The method of claim 39, wherein the AC voltage waveform is a 50% duty cycle.

41. The method of claim 40, wherein the device has a time for an intensity of the device to decrease to one-half of a maximum intensity under a 50% duty cycle at 5 V and 1 kHz of at least 200 hours.

42. A method of manufacturing a solid state electrochemical light-emitting device comprising:

depositing a solid layer including a non-polymeric metal complex distributed in a polymer matrix onto a first electrode; and placing a second electrode onto the solid layer, wherein the device has an external efficiency of at least 1.0 percent at a luminance of at least 30 $cd/m^2$.

* * * * *

UNITED STATES PATENT AND TRADEMARK OFFICE
CERTIFICATE OF CORRECTION

PATENT NO.        : 6,630,793 B2
APPLICATION NO.   : 09/928515
DATED             : October 7, 2003
INVENTOR(S)       : Michael F. Rubner Page 1 of 1

It is certified that error appears in the above-identified patent and that said Letters Patent is hereby corrected as shown below:

Please delete the paragraph titled 'FEDERALLY SPONSORED RESEARCH OR DEVELOPMENT', encompassing Column 1, lines 13-18:

"This invention was made with government support under Grant Nos. N00014-91-J-1381 and N00014-95-1-1291 awarded by the Department of the Navy AND Grant No. DMR-9808941 awarded by the National Science Foundation. The government may have certain rights in the invention."

and replace with:

--This invention was made with government support under Grant Nos. ATM-9819598 and N00014-91-J-1381 awarded by the Navy ONR, and under Grant No. DMR9808941 awarded by the National Science Foundation. The government has certain rights in this invention.--

Signed and Sealed this
Thirtieth Day of October, 2012

David J. Kappos
*Director of the United States Patent and Trademark Office*